United States Patent

Lev et al.

[11] Patent Number: 5,113,096
[45] Date of Patent: May 12, 1992

[54] BICMOS CIRCUIT

[75] Inventors: Lavi A. Lev, San Jose, Calif.; Ian A. Young; Jeffrey K. Greason, both of Portland, Oreg.

[73] Assignee: Intel Corporation, Santa Clara, Calif.

[21] Appl. No.: 679,637

[22] Filed: Apr. 2, 1991

Related U.S. Application Data

[63] Continuation-in-part of Ser. No. 540,342, Jun. 19, 1990, Pat. No. 5,049,765.

[51] Int. Cl.[5] .............................. H03K 19/02
[52] U.S. Cl. ............................ 307/446; 307/570
[58] Field of Search ................ 307/446, 570, 475

[56] References Cited

U.S. PATENT DOCUMENTS

| | | | |
|---|---|---|---|
| 4,425,516 | 1/1984 | Wanlass | 307/446 |
| 4,558,234 | 12/1985 | Suzuki et al. | 307/446 |
| 4,678,943 | 7/1987 | Uragami et al. | 307/473 |
| 4,701,642 | 10/1987 | Pricer | 307/446 |
| 4,837,462 | 6/1989 | Watanabe et al. | 307/449 |
| 4,845,385 | 7/1989 | Ruth, Jr. | 307/446 |
| 4,853,560 | 8/1989 | Iwamura et al. | 307/296 |
| 4,871,928 | 10/1989 | Bushey | 307/446 |
| 5,030,856 | 7/1991 | Dansky et al. | 307/475 |
| 5,049,765 | 9/1991 | Young et al. | 307/446 |

Primary Examiner—David Hudspeth
Assistant Examiner—Andrew Sanders
Attorney, Agent, or Firm—Blakely, Sokoloff, Taylor and Zafman

[57] ABSTRACT

A BiCMOS logic circuit which implements single stage inverting and non-inverting logic functions is described. The circuit includes pull-up and pull-down assembly means coupled between the input and the non-inverting output nodes. The pull-down assembly means comprises a pair of complimentary metal-oxide semiconductor field-effect transistors connected in an inverter configuration in which the gates of the pair of CMOS transistors are coupled to the input node while the output of the inverter configuration provides the inverting output while driving the gate of a n-channel transistor coupled between the non-inverting output node and $V_{ss}$.

12 Claims, 6 Drawing Sheets

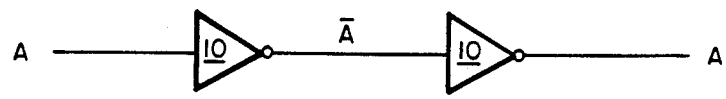
FIG_1 (PRIOR ART)
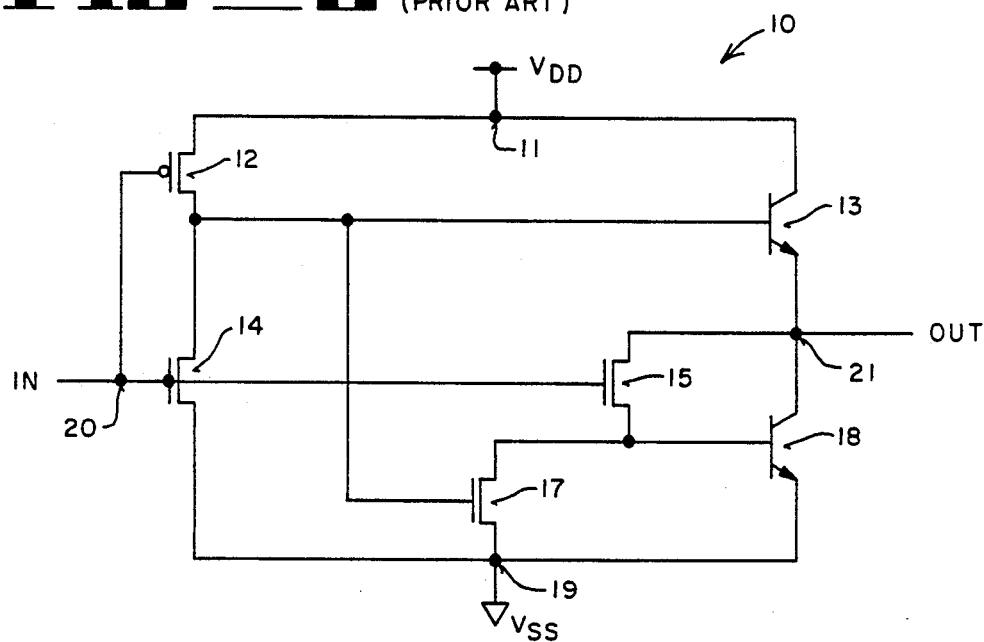
FIG_2 (PRIOR ART)
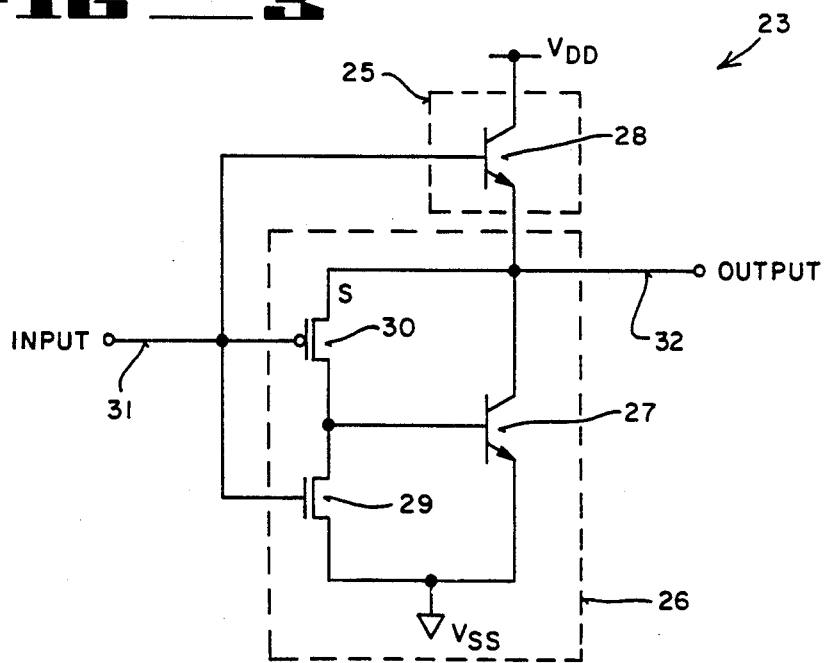
FIG_3

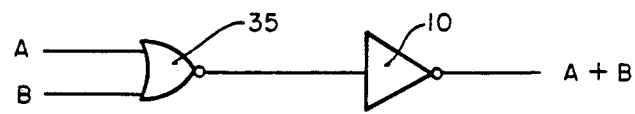
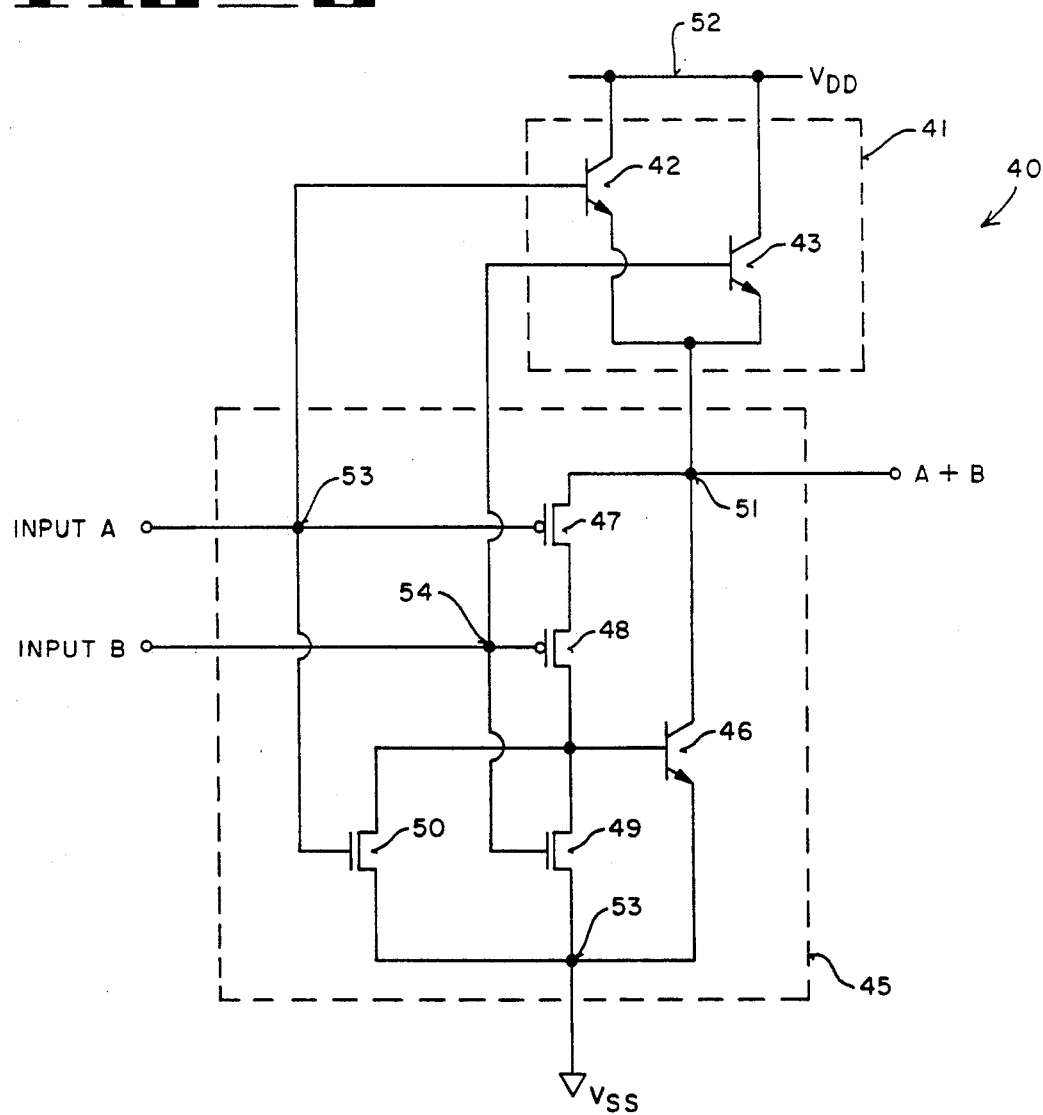

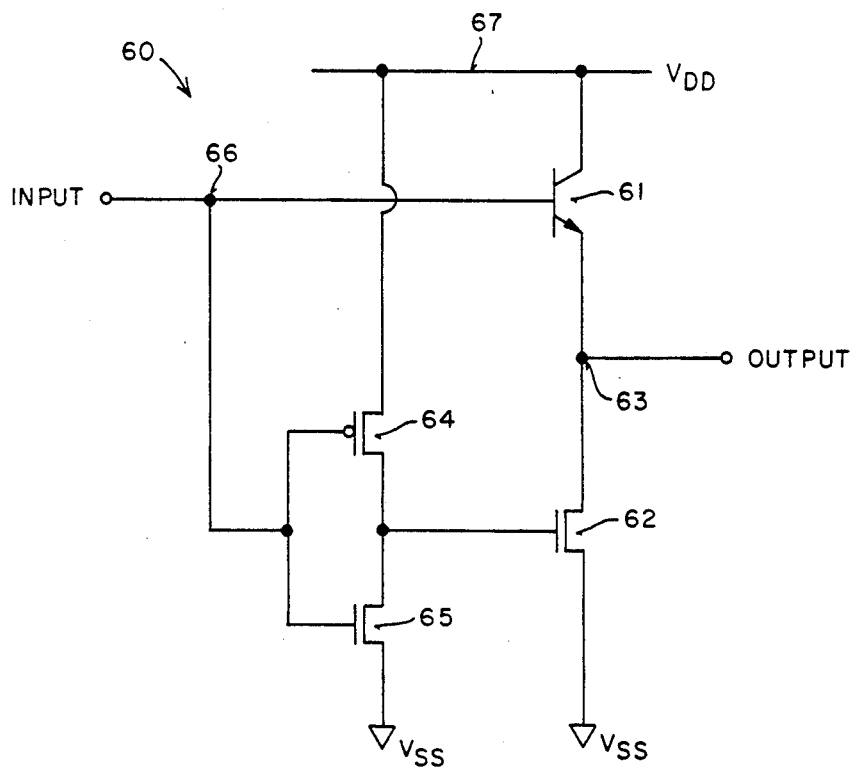
FIG_6
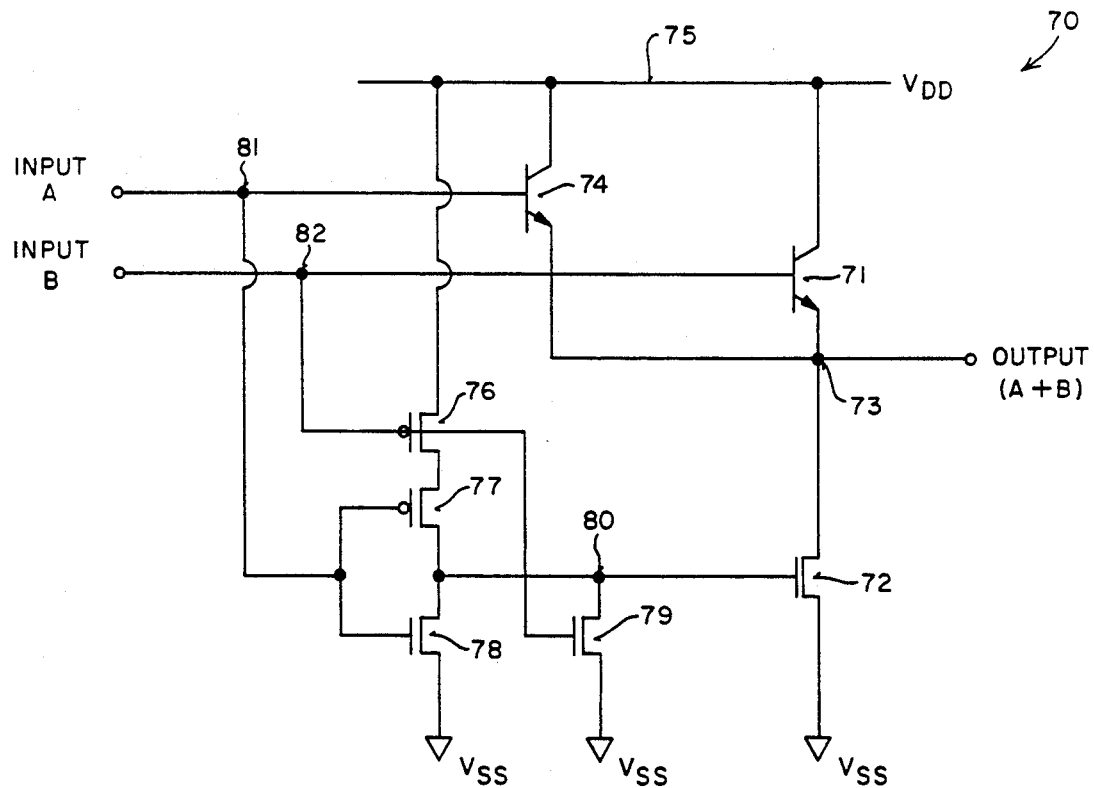
FIG_7

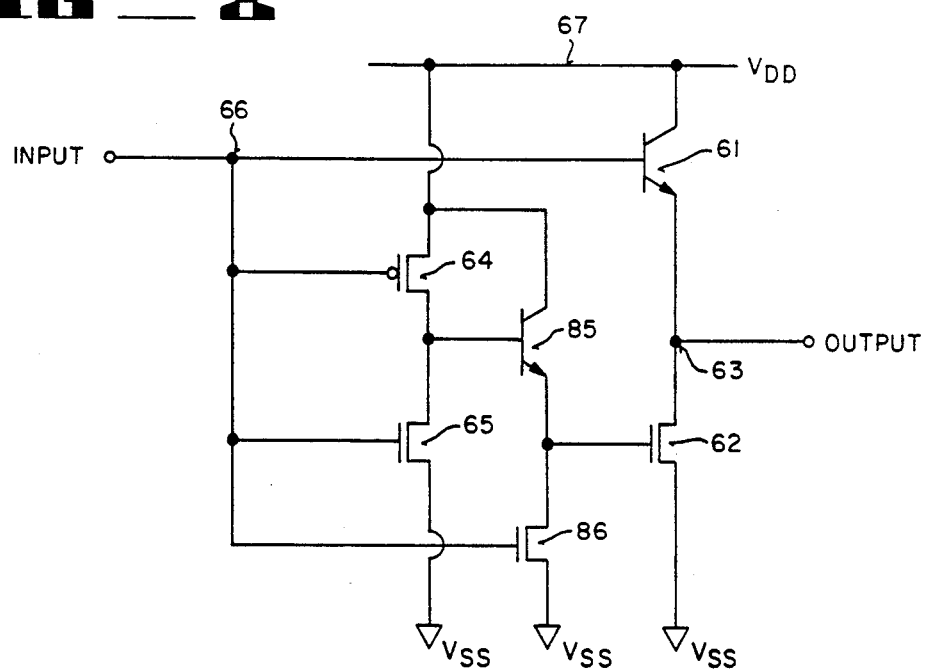
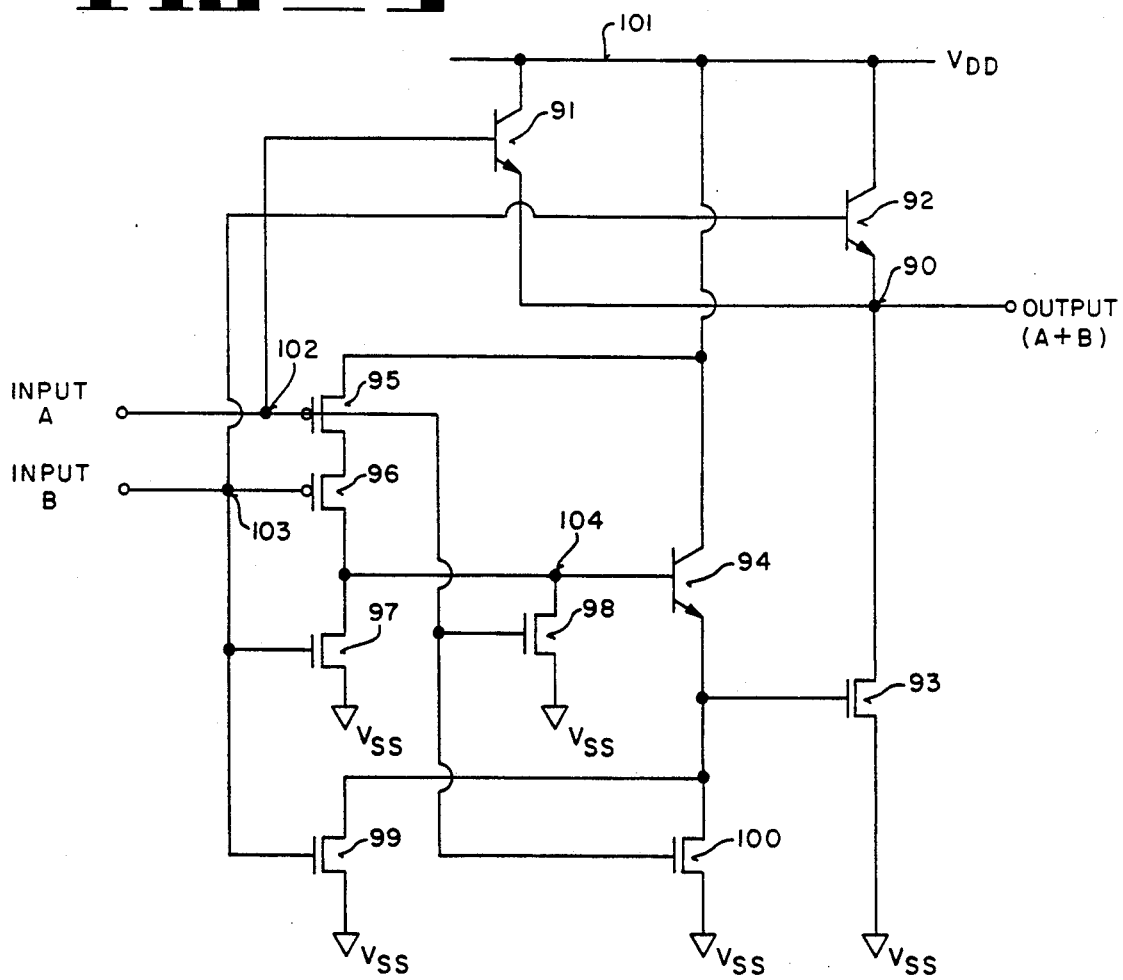

FIG_10
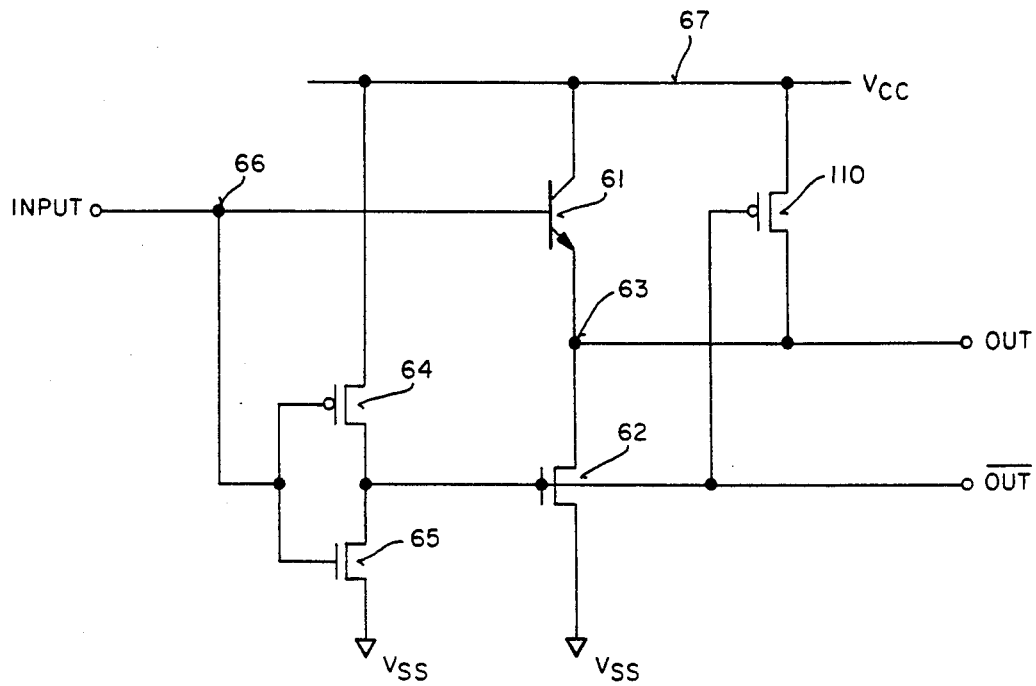
FIG_11
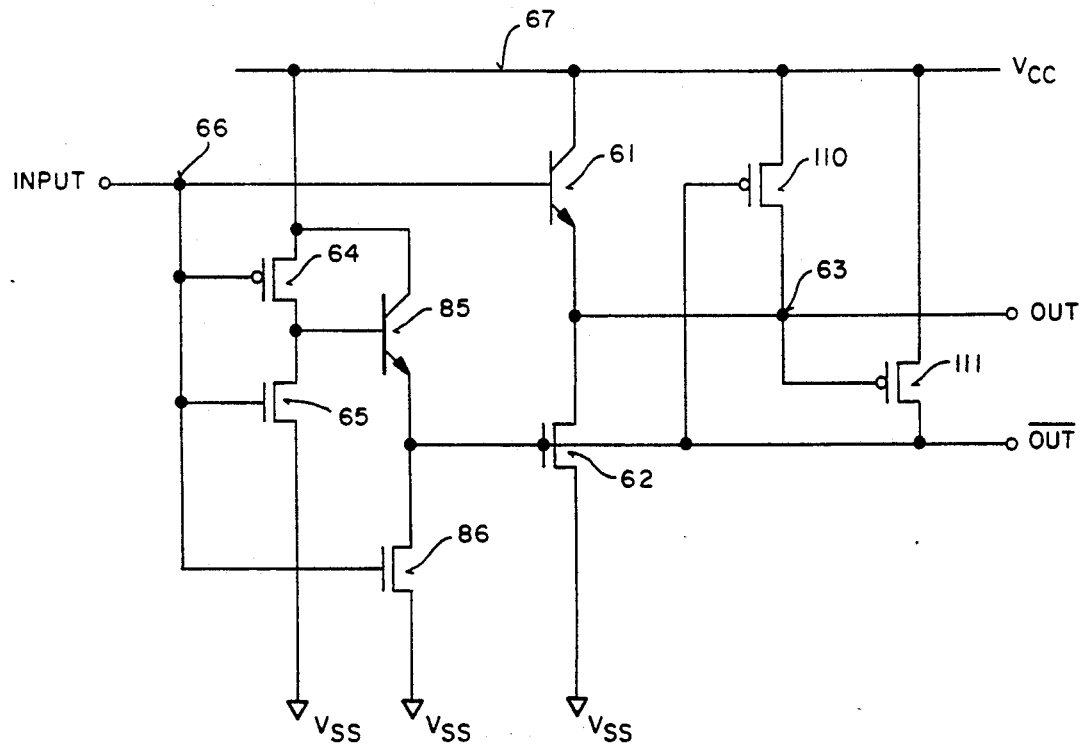

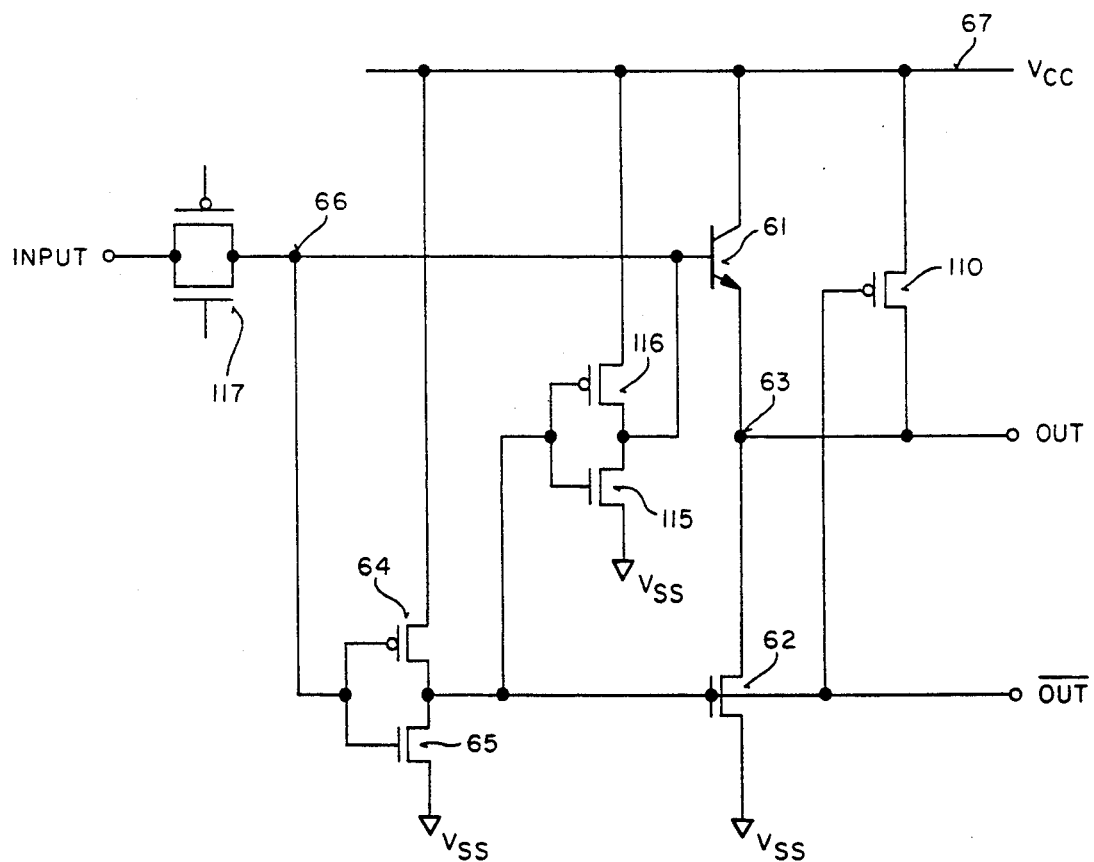
FIG_12

BICMOS CIRCUIT

CROSS-REFERENCE TO RELATED APPLICATIONS

This application is a continuation-in-part (CIP) application of Ser. No. 07/540,342; filed Jun. 19, 1990, now U.S. Pat. No. 5,049,765 which is assigned to the assignee of the present invention.

FIELD OF THE INVENTION

The present invention relates to the field of integrated circuits which combine bipolar and complimentary metal-oxide semiconductor (CMOS) devices on the same substrate.

BACKGROUND OF THE INVENTION

In recent years much effort has been directed toward developing digital logic circuits which combine bipolar and CMOS technologies in a single integrated circuit. The marriage of bipolar and CMOS technologies is particularly advantageous since the superior aspects of each may be exploited and combined to yield optimal circuit performance.

For example, CMOS circuits have the advantages of extremely low quiescent power consumption, rail-to-rail output capability, high density and a very high input impedance. Bipolar logic circuits, on the other hand, are useful in driving large capacitive loads, have fast switching capabilities and feature better performance over temperature and power supply. These attributes have led to the development of a family of BiCMOS inverting logic circuits which employ bipolar transistors to drive output loads, while utilizing CMOS devices to perform the basic logic functions.

BiCMOS inverter circuits (including the closely-related category of NAND logic gate circuits) are numerous and well-known in the prior art—so much so that their use dominates most digital logic designs. This reliance is so pervasive that, for instance, the conventional way of implementing a non-inverting buffer is to connect two inverting buffers in series. In other words, non-inverting logic circuits are essentially devoid in past designs.

In general, non-inverting logic functions (e.g., OR gates) have been implemented in the past using inverting logic circuits (e.g., NOR gates) connected in series with an inverting buffer. The obvious disadvantage of such a configuration is the additional circuitry and greater complexity it requires. Furthermore, by including two logic gates between the input signal and output signal, the delay between a valid input transition and a valid output transition becomes about twice as long as the delay associated with a single stage device.

Another drawback of conventional BiCMOS logic circuitry is its need for high supply voltage during normal operation. This means that many prior art BiCMOS circuits do not operate well once the power supply voltage (e.g., $V_{DD}$) drops from its normal operating range (e.g., 5 volts). This latter characteristic is of particular concern since there is a growing momentum in the semiconductor industry to lower the standard operating supply potential from 5 volts to 3 volts in order to decrease the electric field to which the devices are subjected. When such a change is actually implemented, entire categories of BiCMOS logic circuits devices would no longer be feasible for use in this low operating supply environment.

Thus, what is needed is an integrated circuit combining CMOS and bipolar technologies which implements a non-inverting buffer function in a single stage. Such a circuit should also be capable of operating at a reduced supply potential. As will be seen, the present invention provides a BiCMOS buffer stage providing both inverting and non-inverting outputs. In addition, the invented non-inverting buffer stage is capable of operation at reduced supply potentials. Adoption of the present invention promises to vastly reduce the complexity, while simultaneously increasing the speed and performance of modern digital integrated circuits fabricated using BiCMOS technology.

SUMMARY OF THE INVENTION

Accordingly, it is an object of the present invention to provide a BiCMOS buffer circuit with both inverting and non-inverting outputs.

It is another object of the present invention to provide fast buffering of digital logic signals in a BiCMOS integrated circuit.

Yet another object of the present invention is to provide a BiCMOS logic circuit which implements single stage logic functions capable of operating at low supply potentials.

Still another object of the present invention is to provide a BiCMOS circuit implementing single stage inverting and non-inverting logic functions at a reduced transistor count.

It is another object of the present invention to provide a BiCMOS circuit having a reduced layout area and which provides an output voltage swing between $V_{cc}$ and $V_{ss}$ (i.e., rail-to-rail).

Another object of the present invention is to provide a compact BiCMOS circuit capable of driving large capacitive loads.

In carrying out the above and other objects of the present invention, in one form there is disclosed a BiCMOS circuit comprising pull-up and pull-down assembly means coupled between input and output nodes. The pull-up assembly means is utilized for pulling the output node to a high logic state whenever a high logic potential is applied to the input node. Similarly, the pull-down assembly means drives the output node to a low logic state whenever a low logic potential is applied to the input node. The pull-down assembly means comprises a pair of complimentary metal-oxide semiconductor field-effect transistors connected in an inverter configuration in which the gates of the pair of CMOS transistors are coupled to the input node while the output of the inverter configuration drives the base of a bipolar or NMOS transistor.

BRIEF DESCRIPTION OF THE DRAWINGS

The present invention is illustrated by way of example and not limitation in the figures of the accompanying drawings, in which like references indicate similar elements, and wherein:

FIG. 1 is a logic schematic of a prior art implementation of a non-inverting buffer using two inverting buffers connected in series.

FIG. 2 is a circuit schematic of a typical prior art BiCMOS inverter.

FIG. 3 is a circuit schematic of the BiCMOS buffer stage of the present invention.

FIG. 4 is a logic diagram of a prior art implementation of a BiCMOS OR function.

FIG. 5 illustrates the BiCMOS circuit schematic of the present invention implementing the OR logic function in a single stage device.

FIG. 6 illustrates an alternative embodiment of the present invention implementing a BiCMOS buffer stage.

FIG. 7 illustrates a BiCMOS circuit implementation of a 2-input OR gate which is based upon the embodiment of FIG. 6.

FIG. 8 is an alternative embodiment of the BiCMOS circuit of FIG. 6 for driving large capacitive loads.

FIG. 9 is an alternative embodiment of the BiCMOS circuit of FIG. 7 for driving large capacitive loads.

FIG. 10 shows a modified version of the BiCMOS buffer circuit of FIG. 6 wherein both inverting and non-inverting outputs are provided.

FIG. 11 illustrates another embodiment of the circuit of FIG. 6 also providing dual logic outputs for driving large capacitive loads.

FIG. 12 illustrates an alternative embodiment of the buffer circuit of FIG. 6 which includes additional devices for latching the data being propagated.

DETAILED DESCRIPTION OF THE INVENTION

A BiCMOS buffer circuit and logic gates are described. In the following description, numerous specific details are set forth, such as device types, voltages, etc., in order to provide a thorough understanding of the present invention. However, it will be obvious to one skilled in the art that the present invention may be practiced without these specific details. In other instances, well-known elements have not been shown or described to avoid unnecessarily obscuring the present invention.

I. DISCUSSION OF THE PRIOR ART

Before describing the present invention in detail, a basic understanding of conventional BiCMOS logic circuits will aid in appreciation of the details to follow.

With reference to FIG. 1, a logic diagram illustrating a past approach for implementing non-inverting buffers in a BiCMOS circuit is illustrated. As previously described, non-inverting BiCMOS buffers are conventionally implemented by connecting two inverting buffers 10 in series. Thus, application of the input logic signal "A" to the input of inverter 10 ultimately produces an output signal "A", shifted in time by the combined delays associated with both inverters.

FIG. 2 illustrates a schematic of a prior art inverter circuit 10. The circuit of FIG. 2 is described in connection with FIG. 5.3(A) in "BiCMOS Technology and Applications", edited by Antonio R. Alvarez, Kluwer Academic Publishers, 1990. Inverter circuit 10 includes p-channel MOS (PMOS) transistor 12 and n-channel MOS (NMOS) transistors 14, 15 and 17. Also included are bipolar transistors 13 and 18 arranged in totem-pole fashion to provide a "push-pull" output drive function at node 21. PMOS device 12 is shown connected between the positive supply potential ($V_{DD}$) provided at node 11, and the base of NPN transistor 13. One terminal of NMOS device 14 is coupled to the base of NPN transistor 13 while the other terminal is coupled to $V_{SS}$ (e.g., ground) at node 19. Transistor 17 is coupled across the base-emitter junction of NPN transistor 18. The gate of transistor 17 is coupled to the base of NPN transistor 13. NMOS device 15 is shown being coupled across the base-collector junction of NPN transistor 18. Each of field-effect transistors 12, 14 and 15 have their gate commonly connected to input node 20.

To explain the operation of BiCMOS inverter 10, consider first the effect of a logical low input (e.g., 0 volts) applied to input node 20. A low input voltage at node 20 causes PMOS device 12 to turn on, so that a highly conductive channel exists to source base current into pull-up transistor 13. NMOS devices 14 and 15, on the other hand are cut off; therefore, there is no D.C. path to supply base current to NPN transistor 18. Conversely, due to the high voltage potential at the base of transistor 13, NMOS device 17 will be on, thereby turning off the common emitter NPN transistor 18.

A second situation exists when a high voltage is placed on input node 20. For this situation, NMOS device 15 is able to provide base current to NPN transistor 18. This will discharge the load coupled to node 21 within a $V_{BE}$ of ground. Note that PMOS device 12 is cut off; thus, NPN transistor 13 has no D.C. base current and is in fact kept off by NMOS device 14 pulling the base voltage low.

It is important to appreciate that the circuit of FIG. 2 has a logical low output voltage ($V_{OL}$) statically limited to a $V_{BE}$ above ground. To begin the switching event, the input must exceed a potential equal to $V_{BE}+V_T$. This creates a limitation on the minimum operating supply potential. Because the input will, in most instances, be driven by a previous inverter stage, the inverter of FIG. 2 actually requires a relatively high supply potential (e.g., 5 volts) which has sufficient head room (e.g., $2 V_{BEs}+V_T$) to maintain proper functionality. This constraint on supply voltage generally eliminates the BiCMOS inverter circuit of FIG. 2 from consideration in use in circuits employing a reduced power supply (i.e., <5 volts).

FIG. 4 illustrates a standard prior art technique for implementing an OR operation using orthodox BiCMOS logic gates. The circuit schematic of FIG. 4 comprises NOR gate 35 coupled in series with inverter 10 to implement the logical sum of inputs "A" and "B" (i.e., A+B). Obviously, the main drawback of the logic circuit of FIG. 4 is the inclusion of a second inverter stage, along with its associated delay, in the signal path.

II. DISCUSSION OF THE PRESENT INVENTION

With reference to FIG. 3, there is shown the BiCMOS buffer circuit 23 of the present invention. Buffer circuit 23 comprises pull-up assembly 25 and pull-down assembly 26. Pull-up assembly 25 includes an ordinary NPN bipolar transistor 28 configured as an emitter follower. The collector of transistor 28 is shown coupled to the positive supply potential $V_{DD}$ (e.g., 3-5 volts), the base of transistor 28 is coupled to input node 31, and the emitter of transistor 28 is coupled to output node 32.

If input node 31 is taken to a high logical state (e.g., 5 volts) while the output voltage at node 32 is low (e.g., 0 volts), a high current will flow from the positive supply to the output, thereby pulling the voltage at output node 32 to a logical high level. Note that for this situation, current is supplied to the base of transistor 28 by the high voltage presented at node 31. As will be described below, with input node 31, high, pull-down assembly 26 is inactive.

Pull-down assembly 26 includes p-channel MOS transistor 30 and n-channel MOS transistor 29, which are configured to resemble a CMOS inverter. In other words, PMOS device 30 and NMOS device 29 are connected in series between output node 32 and ground, with their gates being commonly tied to input node 31. The drains of NMOS device 29 and PMOS device 30 (i.e., the output of the CMOS inverter configuration) are both coupled to the base of NPN bipolar transistor 27. The emitter of transistor 27 is coupled to ground while the collector is coupled directly to output node 32. Together, bipolar transistors 28 and 27 are configured as a totem-pole output stage, with the source of PMOS device 30 being coupled to output node 32. Device 30 operates in a source follower mode with its output boosted by bipolar transistor 27.

Recognize that in a typical BiCMOS process, p-channel devices are fabricated within N-well regions (also referred to as bulk regions) formed in the semiconductor substrate. In many cases, the particular process flow mandates that these bulk regions be coupled directly to the positive supply potential, e.g., $V_{CC}$. However, in processes which allow separate biasing of the bulk, it is preferred to couple the bulk of PMOS device 30 to output node 32. Doing so lowers the $V_T$ of transistor 30 and eliminates the body effect resulting in an output which more closely tracks the input voltage.

To fully understand the operation of pull-down assembly 26, consider the case in which output node 32 is high and input node 31 transitions from a logical high to a logical low state. With input node 31 at a logical low voltage, PMOS device 30 becomes conductive so that current flows from output node 32 into the base of bipolar transistor 27, pulling it high. In response, NPN transistor 27 turns on, which pulls output node 32 down to a low potential.

Realize that in fabricating pull-down assembly 26, it is desirable to keep the base capacitance of transistor 27 to a minimum. Keeping this capacitance small relative to the capacitance present at output node 32 eliminates charge sharing effects across PMOS device 30. These charge sharing effects might adversely influence the discharge rate at the output. Notwithstanding, even with charge sharing effects, the logical operation of pull-down assembly 26 remains the same; that is, a low voltage at input node 31 produces a low voltage at output node 32, and vis-a-versa.

For the situation where input node 31 is driven high, NMOS transistor 29 is turned on and PMOS device 30 is cut off. Turning on MOS transistor 29 discharges the base of bipolar transistor 27 to ground thereby turning transistor 27 off. This allows output node 32 to be pulled high by the operation of pull-up assembly 25 as described above.

In circuit 23, the initiation of switching in the pull-down stage occurs when the input signal falls one p-channel MOSFET threshold below its source, which is connected to the output node 32. Initially, the output node is at or close to supply voltage $V_{DD}$. This means that the drive on the base of bipolar transistor 27 is largely insensitive to the positive supply voltage $V_{DD}$. Thus, the circuit retains its switching speed to low supply voltages (e.g., 3 volts). Buffer circuit 23 is, therefore, ideally suited for use in circuits having a low operating supply potential.

At first glance, the operation of circuit 23 may seem somewhat prosaic. However, practitioners in the art will appreciate the overall simplicity and advantages provided by circuit 23. In large part, these advantages are derived from the pull-down assembly configuration wherein a p-channel device is coupled across the collector-base junction of bipolar transistor 27, while an n-channel device 29 is coupled across the base-emitter junction of bipolar transistor 27.

Effectively, PMOS device 30 functions as a pseudo or quasi-PNP emitter follower, due to the feedback it provides from the collector to the base of NPN transistor 27. Therefore, the pull-down assembly allows the present invention to operate as if it were a fully complimentary BiCMOS device, i.e., comprising both NMOS, PMOS and NPN, PNP transistors. (Normally, PNP transistors are eschewed in BiCMOS circuits because of the added complexity and difficulties they introduce into the fabrication sequence). Surprisingly, the composite circuit of FIG. 3 provides its non-inverting logic operation utilizing only two bipolar transistors and two MOS transistors. This represents a minimum device count for a BiCMOS buffer stage. Moreover, only a single BiCMOS stage is present between the input and output nodes resulting in a shorter signal delay.

The basic concept presented in the circuit of FIG. 3 can be further extended to implement a variety of non-inverting logic gates, such as an OR gate. These non-inverting logic gates are implemented in the same manner as the non-inverting buffer of circuit 23; that is, by substituting either parallel or series connected devices for the single n-channel or p-channel transistors, respectively, just as is done in normal CMOS gates. By way of example, FIG. 5 is a circuit schematic of a two-input OR gate realized using standard BiCMOS technology. OR gate 40 comprises a pull-up assembly 41 and a pull-down assembly 45. Pull-up assembly 41 comprises a pair of NPN bipolar transistors 42 and 43 configured as emitter followers wherein each of transistors 42 and 43 have their emitters coupled to output node 51, their collectors coupled to positive supply line 52 (i.e., $V_{DD}$), and their respective bases coupled to input nodes 53 and 54.

The pull-down assembly of FIG. 5 includes a structure resembling a CMOS 2-input NOR driving the base of NPN bipolar transistor 46. The 2-input CMOS NOR structure comprises PMOS devices 47 and 48 connected in series between output node 51 and the base of transistor 46. NMOS devices 49 and 50 are coupled in parallel between the base of transistor 46 and ground node 53. The gates of devices 49 and 48 are commonly coupled to input node 54, while the gates of devices 47 and 50 are both coupled to input node 53. In accordance with the same principles described in connection with the buffer of FIG. 3, the PMOS devices in FIG. 5 are coupled across the collector-base junction of transistor 46 while the NMOS devices are coupled across the base-emitter junction of bipolar transistor 46.

If one reduces the series/parallel device pairs down to their single transistor equivalents, the analysis of the 2-input NOR gate of circuit 40 is similar to that of the buffer of FIG. 3. Output node 51 is pulled high if either input "A" (coupled to node 53) or input "B" (coupled to node 54) is raised to a high voltage, by virtue of the emitter configuration of pull-up assembly 41. Thus, the invention takes advantage of emitter dotting principles of ECL circuit designs.

Both transistors 42 and 43 are shut off if both "A" and "B" are low (e.g., 0 volts). When both inputs "A" and "B" are low, PMOS devices 47 and 48 are turned on. This provides a conductive path between output node 51 and the base of transistor 46. This pulls the base of transistor 46 high—turning it on to discharge the output voltage present at node 51. Note that when input nodes 53 and 54 are both low. NMOS devices 49 and 50 are off.

If either input A or B is high, then one of the NMOS devices (either 49 or 50) will be turned on, thereby grounding the base of transistor 46. With its base grounded, transistor 46 is shut off and output node 51 is free to be pulled high by either of emitter followers 42 or 43.

The BiCMOS buffer circuit of FIG. 3 can be expanded to form the BiNMOS buffer 60 of FIG. 6. Basically, the difference between buffer 23 (FIG. 3) and buffer 60 (FIG. 6) lies on the fact that transistor 27 is now replaced by NMOS device 62. Also, PMOS transistor 64 is now shown having its source coupled to the positive operating supply potential (e.g., $V_{DD}$) along line 67. The remainder of buffer 60 functions in a similar manner to that of buffer 23. Bipolar transistor 61 has its collector coupled to $V_{DD}$, its base coupled to input node 66, and its emitter coupled to output node 63. Thus, NPN transistor 61 operates as a traditional emitter follower output.

Collectively, PMOS transistor 64 and NMOS transistor 65 operate as a traditional CMOS inverter with the gates of devices 64 and 65 being coupled to input node 66. The output of the CMOS configuration is coupled to the gate of NMOS transistor 62. Transistor 62 has its source coupled to $V_{SS}$ (i.e., ground) and its drain coupled to output node 63.

During operation, when a high input is applied at node 66, PMOS device 64 is turned off and NMOS device 65 is on. This grounds the gate of device 62, turning it off. The high voltage at node 66 supplies base current to transistor 61 which, in turn, generates a logical high output voltage at node 63.

For the reverse situation in which a low voltage is applied to input node 66, transistors 61 and 65 are off. Conversely, PMOS device 64 is on (i.e., conductive) so that the supply potential $V_{DD}$ is applied to the gate of NMOS device 62. This turns on device 62, thereby creating a conductive path between output node 63 and the supply potential $V_{SS}$.

BiNMOS buffer 60 has the advantage of having an output voltage swing which extends completely down to $V_{SS}$ (e.g., ground). In the circuit of FIG. 3, the logical low output voltage at node 32 only reaches within 0.2 volts to 0.6 volts of $V_{SS}$ depending on the device sizes employed and the magnitude of the output capacitive load.

Furthermore, the circuit of FIG. 6 is advantageous in situations where layout area must be minimized. Since the layout area of a MOSFET is considerably smaller than that of a bipolar device, utilizing NMOS device 62 in place of an NPN bipolar transistor decreases the cell size considerably. It is appreciated by practitioners in the art that the speed degradation associated with buffer 60 is negligible when compared to buffer 23 of FIG. 3 for small output capacitive load applications. Of course, in cases in which a large output capacitance must be driven, buffer 23 may be preferred due to the full bipolar output stage. FIG. 8, to be discussed shortly, shows a BiNMOS buffer circuit capable of driving relatively large capacitive loads.

FIG. 7 illustrates a BiNMOS 2-input OR gate 70. The construction and operation of OR gate 70 is similar to that described in connection with the OR gate 40 of FIG. 5. The main difference lies in the fact that NPN bipolar transistor 46 has been replaced with NMOS device 72 in the output portion of the circuit. Also PMOS transistor 76 is shown having its source coupled to $V_{DD}$ line 75 rather than to output node 73.

As before, the pull-up stage of gate 70 comprises NPN transistors 74 and 71 configured as emitter followers driving output node 73. The collectors of transistors 71 and 74 are coupled to supply line 75 while their bases are coupled to input nodes 82 and 81, respectively. Input node 81 is commonly coupled to the gates of PMOS transistor 77 and NMOS transistor 78. Input node 82 is coupled to the gates of PMOS device 76 and NMOS device 79. Taken together, PMOS devices 76 and 77 and NMOS devices 78 and 79 are collectively configured as a 2-input CMOS NOR structure whose output at node 80 is coupled to the gate of NMOS device 72. Device 72 has its source coupled to $V_{SS}$ and its drain connected to output node 73.

The operation of OR gate 70 is exactly analogous to that of the OR gate 40 of FIG. 5. That is, the voltage at output node 73 is pulled high if either input "A" (coupled to node 81) or input "B" (coupled to node 82) is raised to a high positive voltage by virtue of the emitter follower configuration of transistors 71 and 74. With a high voltage present at either of nodes 81 or 82, either of NMOS devices 78 or 79 are turned on, thereby coupling node 80 to $V_{SS}$. This renders the channel region of device 72 non-conductive.

If both inputs "A" and "B" are low, PMOS devices 76 and 77 become conductive and NMOS devices 78 and 79 are turned off. This couples supply potential $V_{DD}$ to node 80, which turns on NMOS device 72. Because of the low voltages on nodes 81 and 82, transistors 71 and 74 are turned off. Thus, with a high voltage present on node 80, NMOS device 72 becomes conductive and output node 73 is pulled down the supply potential $V_{SS}$.

For the case in which the circuit of FIG. 6 is required to drive a large capacitive load, the alternative embodiment of FIG. 8 may be employed. The circuits of FIG. 6 and FIG. 8 have the same basic structure except that the output of the CMOS configuration comprising PMOS devices 64 and NMOS 65 now drive the base of NPN bipolar transistor 85. Transistor 85 has its collector coupled to the positive supply potential along line 67, and its emitter coupled to the gate of NMOS device 62. The buffer of FIG. 8 also includes an additional NMOS transistor 86 which has its source coupled to $V_{SS}$, its drain coupled to the gate of NMOS device 62 and its gate coupled to input node 66. Note that for the situation in which a large capacitive load is coupled to output node 63, faster switching characteristics are obtained if NMOS device 62 has a large device size, i.e., width/length aspect ratio. This allows it to handle relatively large current flows. Thus, transistor 85 becomes useful in driving the relatively large capacitance present at the gate of device 62.

The operation of the BiNMOS circuit of FIG. 8 is analogous to the circuit of FIG. 6. When a low voltage is applied at node 66, PMOS device 64 is turned on to flow current into the base of bipolar transistor 85. When a high input voltage is applied at node 66, NMOS device 86 is turned on, thereby grounding the gate of NMOS device 62. Thereafter, the output is pulled high by operation of bipolar transistor 61.

Similarly, the OR gate of FIG. 9 has advantage over gate 70 of FIG. 7 for the case in which a large capacitive load is coupled to the output node. Again, the basic structure and operation of the circuit of FIG. 9 is identical to that of gate 70 except for the inclusion of an additional bipolar transistor and two n-channel devices. The pull-up stage comprises NPN bipolar transistors 91 and 92 configured as emitter followers coupled to output node 90. The collectors of transistors 91 and 92 are coupled to supply potential $V_{DD}$ along line 101, and their bases are connected to input nodes 102 and 103, respectively. PMOS devices 95 and 96, and NMOS devices 97 and 98 comprise a 2-input CMOS NOR configuration having an output (i.e., node 104) which drives the base of NPN bipolar transistor 94. Transistor 94 and NMOS devices 99 and 100 are included to provide faster switching speed when output node 90 is coupled to a large capacitive load. In most cases, NMOS device 93, will have a large aspect ratio in order to discharge large voltages rapidly.

When a high voltage is applied to either of input nodes 102 or 103, one of input devices 97 or 98 grounds the base of bipolar transistor 94, turning it off. Likewise, a high input turns on at least one of devices 99 or 100 to connect the gate of transistor 93 to $V_{SS}$. Doing so turns transistor 93 off. Output node 90 can then be pulled high by either of devices 91 or 92.

When a low voltage potential is supplied to both of input nodes 102 and 103, PMOS devices 95 and 96 are both turned on. This supplies base current to NPN transistor 94, which then provides a high voltage to the gate of NMOS device 93. This turns on NMOS devices 93 so that a conductive path from node 90 to $V_{SS}$ is established. Of course, with both inputs low transistors 91 and 92 are turned off. In this manner, the circuit of FIG. 9 implements a logical sum (e.g., OR) operation which is capable of driving large capacitive loads.

DISCUSSIONS OF THE EMBODIMENTS OF FIGS. 10 AND 11

FIG. 10 illustrates a modified version of the BiCMOS buffer circuit of FIG. 6, wherein both inverting (e.g., $\overline{OUT}$) and non-inverting (e.g., OUT) outputs are provided. The circuit of FIG. 10 is basically the same as that of FIG. 6 except that the output of the CMOS inverter comprising devices 64 and 65 now provides the inverting output of the circuit, in addition to driving the gate of device 62. The output of the CMOS inverter configuration also drives the gate of p-channel device 110.

In FIG. 10, p-channel device 110 is shown coupled between $V_{CC}$ node 67 and non-inverting output node 63. The addition of device 110 enables the output to provide a full swing up to $V_{CC}$, e.g., +5 V. Without device 110 (and devices 110 and 111 in FIG. 11) the logical high output level ($V_{OH}$) will be somewhat less than $V_{CC}$ (approximately $V_{CC}-V_{BE}$). The reason for this is that in the absence of transistor 110, the emitter of bipolar transistor 61 always remains a $V_{BE}$ below its base (see FIG. 6). Even if the base of bipolar transistor 61 is raised to $V_{CC}$, transistor 61, by itself, is incapable of achieving an emitter voltage higher than $V_{CC}-V_{BE}$. Thus, p-channel device 110 furnishes a full $V_{CC}$ output level which the bipolar alone cannot provide.

Consider the case wherein input node 66 is initially at a relatively low voltage (e.g., 0V). For this condition, the output of the CMOS inverter configuration comprising devices 64 and 65 is high (e.g., $V_{CC}$). Hence, the gate of device 110 is high so that device 110 is essentially off. When input node 66 transitions to a high potential, the output of the CMOS inverter configuration drops down to $V_{SS}$. This has the effect of turning device 110 on, thereby providing a direct path from output node 63 to $V_{CC}$ node 67.

FIG. 11 illustrates a similar modification to the circuit of FIG. 8. Recall that the circuit of FIG. 8 is preferred over the circuit of FIG. 6 when driving relatively large capacitive loads. Likewise, the circuit of FIG. 11, providing both inverting and non-inverting outputs, is preferred to that of FIG. 10 in order to provide faster switching characteristics at its outputs when driving relatively large capacitive loads. The circuit of FIG. 11 further includes an ordinary p-channel transistor 111 coupled between $V_{CC}$ node 67 and the inverting output node. The gate of p-channel device 111 is coupled to non-inverting output node 63.

Analogous to the operation of device 110, device 111 provides a full swing to $V_{CC}$ at the inverting output node in response to a high-to-low transition at input node 66. That is, when node 66 transitions low, output node 63 drops in potential until p-channel transistor 111 is turned on. Once on, transistor 111 provides a direct conductive path from the inverting output node to supply line 67. Hence, the circuit of FIG. 11 furnishes full $V_{CC}$ $V_{OH}$ levels.

FIG. 12 shows another embodiment of the present invention including additional transistors 115 and 116 coupled in a CMOS inverter configuration between $V_{CC}$ and $V_{SS}$. Each of the gates of devices 115 and 116 are connected to the inverting output (e.g., $\overline{OUT}$) of the buffer circuit. The output of the CMOS inverter comprising transistors 115 and 116 is coupled to the base of NPN transistor 61, i.e., node 66. An ordinary transmission or pass gate 117 couples the buffer input to node 66.

The advantage of adding the CMOS inverter represented by devices 115 and 116 is that this provides the buffer circuit with data latching capabilities. That is, when the buffer circuit of FIG. 12 is not propagating data, the most recently applied input may be latched internally. Importantly, this latching capability does not incur any additional cost in terms of circuit operating speed.

It should be understood that the latch capability is provided by the feedback connection from $\overline{OUT}$ to node 66 through devices 115 and 116. Transmission gate 117 is employed to isolate node 66 from subsequent level changes in the input voltage, so that the latched data remains undisturbed until such time that new data is to be latched. In this respect, note that the gates of the n-channel and p-channel devices comprising gate 117 are typically coupled to a clocking signal which synchronizes when data is passed (and subsequently latched within) the buffer circuit of FIG. 12.

We claim:

1. A BiCMOS logic gate providing both inverting and non-inverting output signals comprising:
   a bipolar transistor having its collector coupled to a first operating potential, its base connected to an input node and its emitter coupled to a non-inverting output node;
   a first field-effect device coupled between said non-inverting output node and a second operating potential;
   second and third field-effect coupled as a CMOS inverter connected between said first and second operating potentials, the inverting output node of said inverter being coupled to the gate of said first field-effect device and also providing said inverting output signal of said circuit;

a fourth field-effect connected between said first operating potential and said non-inverting output node, the gate of said fourth field-effect device being driven by said inverting output node;

the gates of said second and third field-effect devices being connected to said input node such that when a logical high signal is applied to said input node said non-inverting output node is driven to a high logic state approximately equal to said first operating potential and said inverting output node is driven to a low logic state approximately equal to said second operating potential, and when a logic low signal is applied to said input node said non-inverting output node is driven to said low logic state and said inverting output node is driven to said high logic state.

2. The circuit of claim 1 wherein said first operating potential is a high positive supply potential, and said second operating potential is ground.

3. The circuit of claim 2 wherein said bipolar transistor comprises an NPN transistor.

4. The circuit of claim 3 wherein said first and third field-effect devices comprise n-channel MOS transistors, and said second and fourth field-effect devices comprise p-channel MOS transistors.

5. The circuit of claim 4 wherein switching occurs in said circuit from a high-to-low state whenever said input node falls one p-channel MOS voltage threshold below said high positive supply potential.

6. The circuit of claim 2 further comprising latching means for latching either said high or low logic state in the absence of a logical signal being applied to said input node, the propagation delay of data through said circuit being unaffected by said latching means.

7. The circuit of claim 6 wherein said latching means comprises fifth and sixth field-effect devices coupled in a CMOS inverter configuration between said first and second operating potentials, the gates of said fifth and sixth devices being coupled to said inverting output node and their drains being coupled to the base of said bipolar transistor.

8. A BiCMOS circuit providing both inverting and non-inverting output nodes, each capable of driving relatively large capacitive loads, comprising:

a first bipolar transistor having its collector coupled to a first operating potential, its base connected to an input node and its emitter coupled to said non-inverting output node;

a second bipolar transistor having its collector coupled to said first operating potential and its emitter coupled to said inverting output node;

a first field-effect device coupled between said non-inverting output node and a second operating potential, the gate of said first field-effect device being coupled to said inverting output node;

a second and third field-effect devices coupled in a CMOS inverter configuration between said first and second operating potentials, the drains of said second and third devices driving the base of said second bipolar transistor;

a fourth field-effect device connected between said inverting output node and said second operating potential, the gate of said fourth field-effect device being coupled to said input node;

fifth and sixth field-effect devices coupled between said first operating potential and said non-inverting and inverting output nodes, respectively, the gate of said fifth field-effect device being coupled to said inverting output node, while the gate of said sixth field-effect device being coupled to said non-inverting output node;

the gates of said second and third field-effect devices being connected to said input node such that when a logical high signal is applied to said input node said non-inverting output node is charged to a high logic state approximately equal to said first operating potential while said inverting output node is discharged to a low logic state approximately equal to said second operating potential, and when a logical low signal is applied to said input node said non-inverting output node is discharged to said low logic state while said inverting output node is charged to said high logic state.

9. The circuit of claim 8 wherein said first operating potential is a high positive supply potential, and said second operating potential is ground.

10. The circuit of claim 9 wherein said first and second bipolar transistors comprise NPN transistors.

11. The circuit of claim 10 wherein said first, third, and fourth field-effect devices comprise n-channel MOS transistors, and said second, fifth, and sixth field-effect devices comprise p-channel MOS transistors.

12. The circuit of claim 11 wherein switching occurs within said circuit from a high-to-low state whenever said input node falls one p-channel MOS voltage threshold below said high positive supply potential.

* * * * *